(12) United States Patent
Beer et al.

(10) Patent No.: US 7,380,182 B2
(45) Date of Patent: May 27, 2008

(54) METHOD AND APPARATUS FOR CHECKING OUTPUT SIGNALS OF AN INTEGRATED CIRCUIT

(75) Inventors: Peter Beer, Fontainbleau (FR); Achim Schramm, München (DE); Martin Versen, München (DE)

(73) Assignee: Infineon Technologies AG, Munich (DE)

( * ) Notice: Subject to any disclaimer, the term of this patent is extended or adjusted under 35 U.S.C. 154(b) by 490 days.

(21) Appl. No.: 10/933,645

(22) Filed: Sep. 3, 2004

(65) Prior Publication Data

US 2005/0114734 A1 May 26, 2005

(30) Foreign Application Priority Data

Sep. 5, 2003 (DE) ................. 103 40 917

(51) Int. Cl.
*G01R 31/28* (2006.01)
(52) U.S. Cl. .............. 714/724; 324/73; 326/21
(58) Field of Classification Search ......... 714/724, 714/735; 324/73; 326/21
See application file for complete search history.

(56) References Cited

U.S. PATENT DOCUMENTS 5,696,772 A * 12/1997 Lesmeister ............. 714/32
6,105,157 A * 8/2000 Miller .................... 714/744
6,260,154 B1   7/2001 Jeddeloh
6,480,016 B1 * 11/2002 Motoi et al. .............. 324/765
6,643,787 B1 * 11/2003 Zerbe et al. .............. 713/400
6,950,956 B2 *  9/2005 Zerbe et al. .............. 713/400

FOREIGN PATENT DOCUMENTS

| DE | 100 34 852 | 2/2002 |
|---|---|---|
| DE | 101 04 575 | 8/2002 |
| DE | 101 17 891 | 10/2002 |
| DE | 101 45 745 | 4/2003 |

OTHER PUBLICATIONS

German Patent Office Examination Report Dated May 24, 2004.

* cited by examiner

*Primary Examiner*—Jacques Louis-Jacques
*Assistant Examiner*—Esaw Abraham
(74) *Attorney, Agent, or Firm*—Patterson & Sheridan, L.L.P.

(57) ABSTRACT

Apparatus and method for checking output signals of an integrated circuit are provided. One embodiment provides a method for checking whether signals are output by a write circuit of an integrated circuit according to a predefined specification. In this context, the high precision of an external test device which is inherent to the system is used to check, within a module, that a data signal and a data sampling signal of the integrated circuit are output according to a specification.

6 Claims, 2 Drawing Sheets

METHOD AND APPARATUS FOR CHECKING OUTPUT SIGNALS OF AN INTEGRATED CIRCUIT

CROSS-REFERENCE TO RELATED APPLICATIONS

This application claims foreign priority benefits under 35 U.S.C. §119 to co-pending German patent application number DE 103 40 917.3, filed Sep. 5, 2003. This related patent application is herein incorporated by reference in its entirety.

BACKGROUND OF THE INVENTION

1. Field of the Invention

The invention relates to a method and to an apparatus for checking output signals of an integrated circuit.

2. Description of the Related Art

The operating frequencies of modern, dynamic random access memory modules (DRAMs) are becoming higher and higher. Data in specifications for initial types of memory modules define the chronological relationship which individual signals of the memory modules are to have to one another. This data in the specifications has to be guaranteed to the customers of the memory modules.

Modern test systems for measuring the time behavior of the signals of the memory modules no longer fulfill, in particular, the requirements when measuring an output time behavior of output signals of the memory modules. Inaccuracies in measurements when using the test systems are greater here than is permitted for the values stipulated in the specifications. There are various approaches to overcoming the aforesaid problem. In this context, it is attempted to use what is referred to as a "robust design" of the memory modules in order to guarantee the values of an output time behavior which can no longer be measured. In addition, it is attempted to provide novel test systems which are capable of checking whether the chronological relationships between the signals of the memory modules comply with those stipulated in the specifications.

In the case of the robust design, it is attempted to configure the output time behavior independently of process fluctuations in the manufacture of the memory modules. In this context, the significant factor will no longer be, for example, whether specific switch-on voltages of transistors or resistance values of lines of the memory modules lie in a desired tolerance range. Therefore, in terms of the design and layout, efforts are made to ensure that individual elements of the memory modules, and thus the output time behavior of selected signals, are independent of processing tolerances. However, it is disadvantageous that it is not possible to proceed as far as desired with the robust design because, in particular, it requires additional chip area, making the design expensive. Furthermore, the risk of failures occurring which cannot be tested for rises despite designs which are as robust as possible.

A problem of conventional test systems is that they are usually not capable of determining, with a high level of resolution, chronological relationships between a plurality of signals fed to the test system. This is due in particular to the fact that the test systems make available an internal time standard, generally an internal reference clock signal, with respect to which all the signals fed to the test system are measured. This means that the test system determines computationally the chronological relationships between the signals on the basis of their respective relationship with the reference clock signal. However, it is unfavorable that high chronological resolutions can only be implemented at extremely high cost in this way.

As a result, the second abovementioned approach to solving the problem has the disadvantage that modern and suitable test systems are expensive or are not at all available for high volume testing in which thousands of the memory modules have to be tested within a limited time period.

SUMMARY OF THE INVENTION

According to the above, the object of the present invention is to provide a method and an apparatus for the improved testing of the output time behavior of output signals of memory modules.

The method according to one embodiment of the invention has the purpose of checking whether signals are output by a write circuit of an integrated circuit according to a predefined specification. In this context, a first data signal and an associated second data signal have a chronological relationship with one another, wherein the specification defines a time offset limiting value between the first data signal and the second data signal. The integrated circuit has a read circuit for reading the signals and at least two terminals for applying the first and second data signals. Each of the two terminals is connected to the write circuit and to the read circuit.

In one embodiment, an external first standardization data signal and an associated external second standardization data signal are provided at the respectively assigned terminal of the integrated circuit, the external first standardization data signal and the external second standardization data signal being chronologically offset with respect to one another in accordance with the time offset limiting value of the specification. It is then checked whether the read circuit correctly reads in the first standardization data signal. In one advantageous embodiment, the read circuit is set in such a way that the time offset value essentially corresponds to a limit between detection and nondetection of the external first standardization data signal.

In one development of the method, a first test data signal and an associated second test data signal are provided by the write circuit to be checked in the integrated circuit to the read circuit via the terminals, with the result that test data is received by the read circuit by means of the first test data signal and the second test data signal. Finally, the provided test data is compared with the test data received by the read circuit, a fault being detected if the provided test data differs from the received test data.

This advantageously permits the output time behavior of output signals of the integrated circuit to be tested inside a module. In addition, a high level of precision of an external test system—which is conditioned by the system—when providing standardization data signals is utilized, it being possible for the lower level of precision of the test system when reading is to be ignored.

According to one embodiment of the invention, the memory module is thus advantageously checked by means of an external test device and a modified input/output circuit of the memory module. At the same time, a standardization process for the read circuit of the memory module is firstly carried out in such a way that the memory module is, at a limit, just no longer capable of reading in the external first standardization data signal in a valid fashion using the read circuit. Subsequently, the write circuit of the memory module is tested to provide a result indicating compliance or noncompliance with the specification values.

One embodiment of the invention provides a particularly useful development of an input/output circuit of the memory module together with a standardization process of the read circuit by means of an external test device. As a result, the memory module is effectively supported by the external test device during the inventive checking for compliance with the specification values. It is considered particularly advantageous here that the external test device, which corresponds essentially to the modern test systems mentioned at the beginning, is used selectively with respect to its high precision when providing signals. A small chronological resolution (e.g., due to the system) of chronological relationships between signals which are fed to the test system from outside can advantageously remain unused. A particularly advantageous selective use of the power potential of the modern test systems is supported in this way. The described disadvantages of the conventional test systems can therefore be eliminated by the method according to one embodiment of the invention. The inventive development of the input/output circuit can easily be carried out in the course of the production process and requires only a small degree of additional costs during manufacture in comparison with the unmodified input/output circuit which is provided on a standard basis.

According to a further aspect of the method according to one embodiment of the invention, the time offset limiting value defines a maximum permissible set-up time and/or a minimum necessary hold time between output signals of the integrated circuit. In the process, the setting of the read circuit is carried out cyclically, the second external standardization data signal, which is embodied as an external standardization data sampling signal, being delayed. A time offset value between the external standardization data signal and the external standardization data sampling signal is set in such a way that a change occurs between the detection and the nondetection of the external standardization data signal by the read circuit.

As a result it is advantageously possible to form a standardization process for reading-in behavior of the memory module as precisely as possible at a desired boundary between detection and nondetection of the external standardization data signal.

According to one embodiment of the invention, the time offset value is changed incrementally using a setting circuit, wherein when there is a change from nondetection to detection of the external standardization data signal, the time offset value which is the last to give rise to nondetection of the external standardization data signal is set. When there is a change from detection to nondetection of the external standardization data signal, the time offset value which is the first value to give rise to nondetection of the external standardization data signal is set.

In this way, a high level of precision of an external test device, which is inherent in the system, is utilized to set the time offset limiting value between the data signal and the data sampling signal of the integrated circuit in such a way that a limiting range between the detection and the nondetection of the external standardization data signal is obtained. This advantageously promotes the accuracy of the standardization process of the method according to one embodiment of the invention.

According to a further embodiment of the invention, check results are determined from the deviation between the provided test data and the received test data, wherein the check results are determined after each provision of the test data and the comparison of the provided test data with the test data received by the read circuit. In addition, the check results which are determined can be stored in a cell array of the integrated circuit.

It is thus advantageously possible to carry out the method according to one embodiment of the invention with a wide variety of data patterns and data topologies, enabling an improved and informative test coverage. In this way it is possible to use the stored check results to document a profile of the checking according to one embodiment of the invention and make it reproducible.

The apparatus according to one embodiment of the invention is designed to check the outputting of signals of an integrated circuit according to a predefined specification, the apparatus comprising a write circuit with which a data signal and an associated data sampling signal, which have a chronological relationship with one another, can be output. The apparatus has a read circuit with which the data signal and the data sampling signal can be read in, and at least two terminals for reading in/outputting the signals, one of the terminals being assigned to the data signal and another of the terminals being assigned to the data sampling signal, and each of the terminals being connected to the write circuit and to the read circuit. Furthermore, the read circuit comprises a setting circuit with which a time offset value can be set between the data signal and the associated data sampling signal, wherein an external standardization data signal and an external standardization data sampling signal can be provided at the respectively assigned terminals in such a way that the external standardization data signal and the external standardization data sampling signal are chronologically offset with respect to one another in accordance with the time offset limiting value of the specification. A comparator device is provided which can be used to compare test data written by the write circuit with the test data received by the read circuit, wherein a fault signal can be generated by the comparator device if the written test data differs from the received test data.

BRIEF DESCRIPTION OF THE DRAWINGS

The invention is described below in detail with reference to figures, of which.

DETAILED DESCRIPTION OF THE PREFERRED EMBODIMENT

Figure 1:
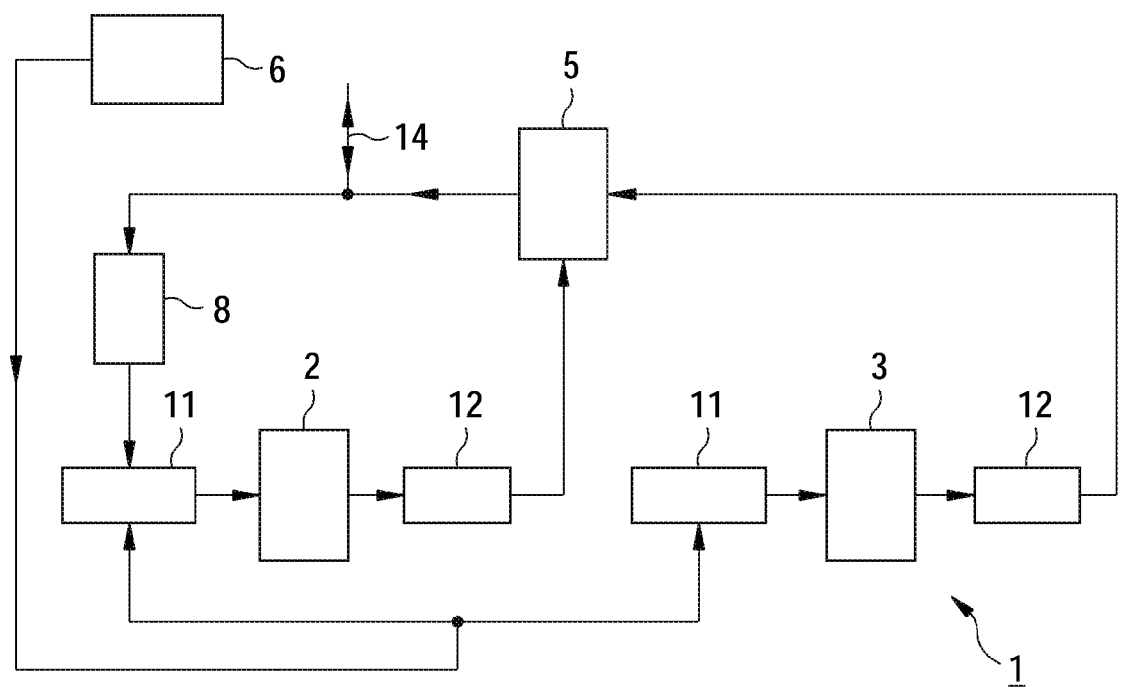
FIG. 1 is a basic block circuit diagram of a typical embodiment of an input/output circuit of a memory module.

FIG. 1 is a schematic view of a design of an input/output circuit 1 which is used, for example, in a dynamic random access memory module with double data rate (DDR-DRAM). The input/output circuit 1 comprises a data signal input/output 2 for feeding or transmitting a data signal and a data sampling signal input/output 3 for feeding or transmitting a data sampling signal. The data signal input/output 2 and the data sampling signal input/output 3 are each connected to a separate driver circuit 11 and to a separate receiver circuit 12. The two receiver circuits 12 are connected to a reception register 5 (latch) which has an output which is connected to an internal data path 14 of the memory module. The reception register 5 reads in the data item of the data signal with a chronological relationship which is to be maintained between the data signal and the data sampling signal. The data sampling signal fulfills the function of a clocking read-in signal, the relationship which is to be maintained relating to specific chronological intervals between the clocking edges of the data sampling signal and valid data of the data signal. In the DDR-RAMs, the chronological relationship which is to be maintained between the data signal and the data sampling signal consists in both rising and falling edges of the data sampling signal being chronologically aligned with a valid data item of the data signal. In this context, it may be necessary to maintain a maximum permitted delay time between each clocking edge of the data sampling signal and each appearance of a valid data item of the data signal. In addition, to read in the data item in a valid fashion, it may be necessary to comply with a minimum time during which the valid data item of the data signal is present at the reception register 5 after each edge of the data sampling signal.

The two receiver devices 12 are provided for a process of writing to the memory module, wherein an external data signal which is to be written is conducted to the data signal input/output 2, and an external data sampling signal is conducted to the data sampling signal input/output 3, and wherein the data signal and the data sampling signal are to have the aforesaid chronological relationships with one another. By means of the two receiver devices 12, the data item is then read in by the reception register 5 in the way described above, after which the reception register 5 subsequently feeds the read-in data item at its output to the internal data path 14.

A synchronization device 6, which is connected to the two driver devices 11, is provided for providing a synchronization signal for the two driver devices 11. The synchronization signal is intended to ensure the aforesaid chronological alignment ("edge alignment") of the data sampling signal with the data signal. In this context, the synchronization device 6 actuates the driver devices 11 of the data signal input/output 2 and of the data sampling signal input/output 3 in such a way that the aforesaid chronological relationships between the data signal at the data signal input/output 2 and the data sampling signal at the data sampling signal input/output 3 are fulfilled. The synchronization device 6 may be embodied as a delay-lock loop (DLL) and can in principle be embodied as a controllable delay circuit.

In a process of reading from the memory module, during which the memory module is an active, i.e. a driving part, of a data change process between the memory module and a reading device, the data from the internal data path 14 passes into an FIFO shift register 8 which feeds the data to the data signal input/output 2 via the driver device 11. The data is finally output to the reading device, for example a controller device, by the data signal input/output 2. The synchronization device 6 ensures, in the way described above, that the chronological reference values (i.e., stipulated in the specification) between the data signal and the data sampling signal are complied with.

When writing into the memory module, an external writing device provides the data sampling signal (DQS signal) and the data item to be written. The reception register 5, which is connected to the data signal input/output 2 via one of the receiver devices 12, evaluates a written data item using an edge of the data sampling signal. In this context, the specification contains a stipulation of the chronological offset value between the data signal and the data sampling signal at which the memory module must remain capable of interpreting correctly the written data item.

During the read access to the memory module, the memory module therefore continuously generates and drives, essentially simultaneously, the data sampling signal and the data signal. The data sampling signal provides signals to the device reading out from the memory module the time at which the data is valid and can be read in by the reading device. In this context, according to the specification the memory module is also allowed to have a certain degree of inaccuracy, due to tolerances, when driving the data sampling signal and the data signal.

The described write access can still easily be checked using contemporary test equipment. For this purpose, the data sampling signal and the data signal must be transmitted to the memory module with a specific chronological relationship using an external test system. This is possible with a high level of accuracy owing to the fact that both signals are provided by the same test system. However, it is no longer possible for the described read access to be checked according to the latest specifications of the memory modules with the test systems which are generally used today. Inaccuracies which result during the measurement of the chronological relationships between the individual edges of the data signal and the data sampling signal can falsify the measured value in such a way that it is not possible to reliably determine whether or not the specification is complied with. This is due above all to the fact that the conventional test systems are not capable of resolving the chronological relationships with sufficient accuracy owing to the computational method of determination.

Therefore, according to one embodiment of the invention, a modification is proposed in the previously described input/output circuit 1 with which the time behavior of the read access can be tested inside a module ("on-chip").

Figure 2:
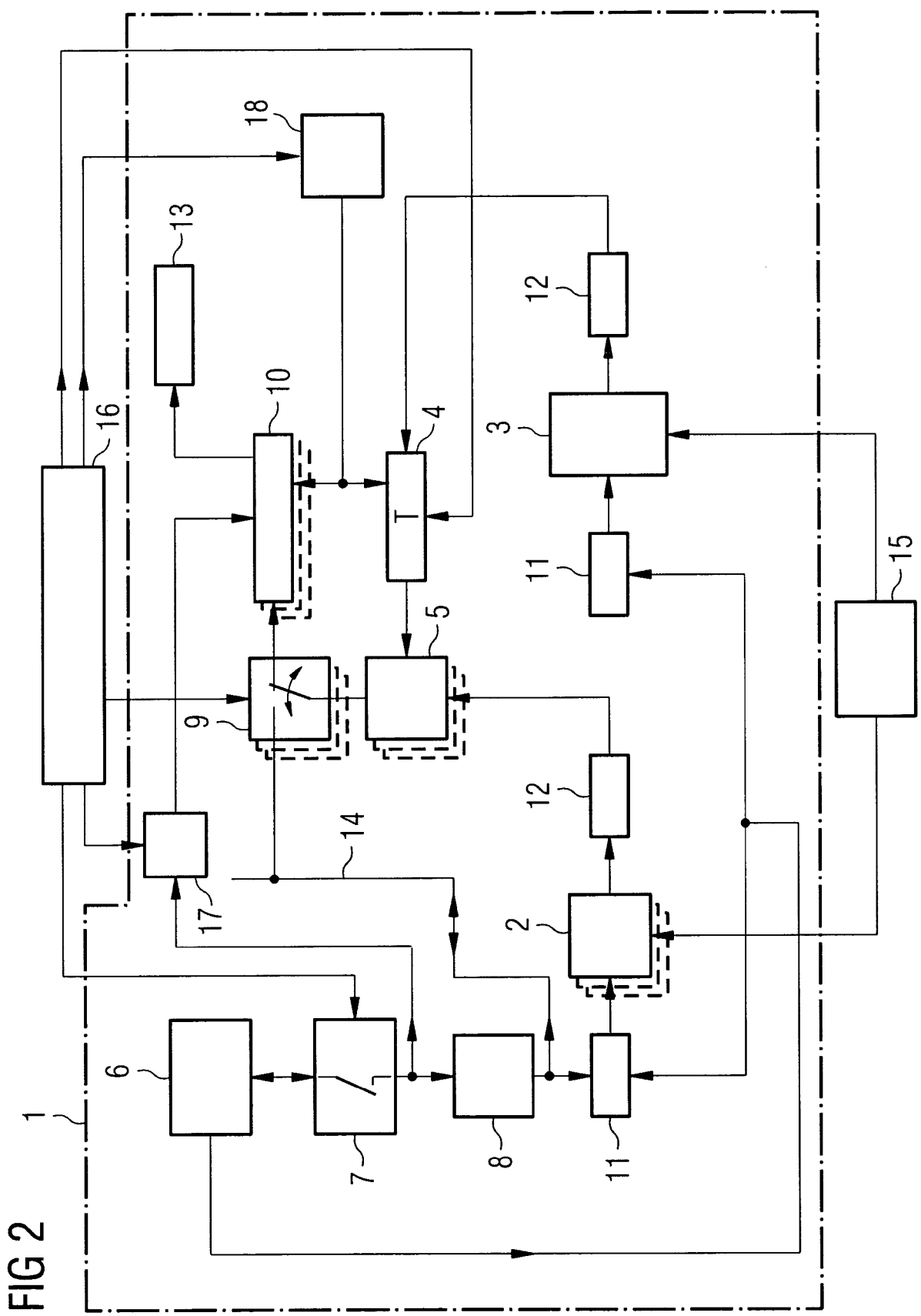
FIG. 2 is a basic block circuit diagram of an embodiment of the apparatus according to one embodiment of the invention.

FIG. 2 is a basic block circuit diagram of an exemplary embodiment of an input/output circuit 1 which is developed according to one embodiment of the invention. FIG. 2 illustrates the input/output circuit 1, which is developed according to one embodiment of the invention, inside a dot-dash border. An external test device 15 and an external test control unit 16 are arranged outside the input/output circuit 1. According to one embodiment of the invention, the memory module may be switched to a test mode by means of the test control unit 16. For this purpose, the test control unit 16 actuates a test data device 7, a delay element 17, a switch device 9, a control device 18 and a programmable delay device 4. The aforesaid elements are used to carry out the method according to one embodiment of the invention in the following way. In this context checking of compliance with a maximum permitted set-up time between the data signal and the data sampling signal during the reading process from the memory module is described as follows.

The switch device 9 is connected to the reception register 5, to the test control unit 16 and to a comparator device 10. To switch the memory module to the test mode, the switch device 9 is switched over by the external test control unit 16 in such a way that data which is read in by the reception register 5 is written into the comparator device 10 by means of the switch device 9. An external standardization data signal is then fed to the data signal input/output 2 and an external standardization data sampling signal is fed to the data sampling signal input/output 3, by the external test device 15 which is connected to the data signal input/output 2 and to the data sampling signal input/output 3. The standardization data signal and the standardization data sampling signal have a defined chronological relationship with one another here so that the data item is latched in by the reception register 5 by means of the receiver device 12 of the data input/output 2 using the standardization data sampling signal. In the process, the standardization data sampling signal is fed to the reception register 5 via the receiver device 12 of the data sampling signal input/output 3. The standardization data sampling signal is delayed using a programmable delay device 4, in such a way that the reception register 5 is no longer capable of latching in the standardization data signal in a valid fashion. This means ultimately that the maximum value which is stipulated in the specification for the set-up time between the standardization data signal and the standardization data sampling signal using the external test device 15 is exceeded so that the memory module is no longer capable of reading in the data item in a valid fashion.

A decision as to whether or not the data item has been read in by the reception register 5 in a valid fashion is taken by the comparator device 10. For this purpose, test data can be written into the test data device 7, for example, before the start of the execution of the method according to one embodiment of the invention. The test data device 7 also writes the test data into the comparator device 10, synchronized with the data of the external test device 15 via the delay element 17. In the comparator device 10, the data of the external test device 15 is then compared with the data of the test data device 7. If the data no longer corresponds, a standardization procedure of the read circuit of the memory module is successfully terminated. This means that the memory module is then no longer capable of reading in, in a valid fashion, the standardization data signals which are written by the external test device 15. An objective of the standardization process described is therefore to set what is referred to as a "PASS/FAIL transition" with respect to the detection of the external standardization data signal.

An approximation to this PASS/FAIL transition may occur either from a PASS side or from a FAIL side. The control device 18 is connected to the test control unit 16 and is actuated by it. In addition, the control device 18 is connected to the comparator device 10 and to the programmable delay device 4. In the delay device 4, it is possible to store a delay value which defines a delay time T of the delay device 4.

The control device 18 controls the programming process of the programmable delay device 4 as a function of the comparison results in the comparator device 10 in the course of the standardization process. In this context, the control device 18 sets the delay time T of the programmable delay device 4 in a setting process which takes place incrementally and cyclically, in such a way that the aimed-at PASS/FAIL transition of the detection of the external standardization data signal is achieved. This is done with a delay time T which is so long that it just no longer gives rise to correct reading in and just gives rise to incorrect reading in. The delay time T which is programmed into the delay device 4 for this purpose is thus the maximum permitted set-up time between the data item of the data signal and one of the edges of the data signal which is exceeded to the smallest possible degree.

When an approximation from the PASS side occurs, the set-up time between the external standardization data signal and the external standardization data sampling signal during the setting process is always complied with. To bring about the PASS/FAIL transition, the control device 18 programs into the programmable delay device 4 that time value which is the first to bring about the desired FAIL result of the detection of the external standardization data signal. This means that now the maximum permitted set-up time between the external standardization data signal and the external standardization data sampling signal for correct reading in is exceeded to the smallest possible degree, as a result of which the memory module is incapable of reading in the external standardization data signal of the external test device 15 in a valid fashion.

When approximation from the FAIL side occurs, the maximum permitted set-up time between the external standardization data signal and the external standardization data sampling signal during the setting process is exceeded permanently. In this case, the control device 18 programs into the programmable delay device 4 that time value which was the last to bring about the nondetection of the external standardization data signal after a transition to a PASS result of the detection of the external standardization data signal. As a result, the desired PASS/FAIL transition of the detection of the external standardization data signal is thus brought about even in the case of approximation from the FAIL side.

The described standardization therefore in principle constitutes a standardization of the delay device 4 of the memory module. For this purpose, according to one embodiment of the invention, an intrinsic delay time of a connection between the receiver device 12 of the data sampling signal input/output 3 and the reception register 5 is shortened or lengthened inside the module using the programmable delay device 4. As a result, the PASS/FAIL transition which is necessary for the method according to one embodiment of the invention, for the recognition of the external standardization data signal can be brought about.

The setting of the PASS/FAIL transition of the detection of the external standardization data signal concludes the standardization of the memory module in the course of the execution of the method according to one embodiment of the invention. The memory module is then set to what is referred to as "internal reading" using the test control unit 16. In this context, the memory module independently writes test data according to an output time behavior which is inherent in the memory module due to its production. For this purpose, test data is transmitted by the test data device 7 to the data signal input/output 2 via the FIFO shift register 8 and the driver device 11. The data is then transmitted from the data signal input/output 2 to the reception register 5 via the assigned receiver device 12. The chronological relationship between the data signal and the data sampling signal is provided by the synchronization device 6. For this purpose, the two driver devices 11 are actuated by the synchronization device 6 in the fashion described above.

Owing to the fact that the values which are stipulated in the specification for the maximum permitted set-up time between the data signal and the data sampling signal are values which are guaranteed to the customer, it is anticipated that the module will comply with these specification values during operation, i.e., the set-up time values will continuously be lower than those of the specification. This means that the delayed data sampling signal which is conducted via the delay device 4 which can be programmed during the standardization process must be capable of bringing about valid reading in of the test data item at the reception register 5. The valid reading in of the test data is evaluated using the comparator device 10, as is also the case for the preceding standardization. In the process, the comparator device 10 compares the test data transmitted by the test data device 7 via the delay element 17 with the test data transmitted by the reception register 5 to the comparator device 10 via the switch device 9.

Results of this comparison are written by the comparator device 10 into a cell array 13 of the memory module. The "internal reading" is intended to provide the proof that the memory module is capable of having values which are lower than the values stipulated in the specification for the maximum set-up time. It is therefore expected that the memory module is capable of constantly surpassing a read-in behavior of the memory module which is standardized to a FAIL behavior using the external test device 15, i.e., of providing a constant PASS behavior. If the test data item which is written by the test data device 7 cannot be read in a valid fashion by the reception register 5, the memory module infringes the specified output time behavior for the maximum set-up time between the data signal and the data sampling signal. This means that the memory module is incapable of complying with the values stipulated in the specification for the maximum set-up time and therefore must not be supplied to the customer.

The checking principle according to one embodiment of the invention may also be used, in a way analogous to the method described above, for checking a minimum necessary hold time between the data signal and the data sampling signal. In this case, it is intended to ensure that the module is capable of providing the minimum necessary hold time between the data signal and the data sampling signal, i.e., constantly exceeding the minimum hold time. The standardization of the memory module, necessary for this purpose, using the external test device 15 is carried out in an analogous fashion to the standardization described above for the maximum permissible set-up time. This means that a PASS/FAIL transition is set for the detection of the external standardization data signal. For this purpose, that time value which gives rise to nondetection of the external standardization signal is programmed into the programmable delay device 4 using the control device 18 as a function of check results of the comparator device 10.

To check the minimum necessary hold time, the internal reading in the memory module is then initiated using the external test control unit 16. The memory module must be capable of using the value programmed in the standardization process for the programmable delay device 4 in the way described above to read in test data from the test data device 7 in a valid fashion. Checking of the internal reading is carried out in a way analogous to that described above for the checking of the maximum permitted set-up time.

The method according to one embodiment of the invention may be repeated advantageously with various data topologies, temperatures and electrical voltage levels so that a better test coverage is achieved. A greater reserve in comparison with the values of the specification may be achieved by setting the value programmed in the standardization process for the programmable delay device 4 in an even more critical fashion. For example, when the minimum necessary hold time is checked, the value which is programmed into the programmable delay device 4 can be increased by a further increment after the PASS/FAIL transition. As a result, even greater requirements are made of the memory module in terms of the compliance with the minimum necessary hold time, which advantageously increases the reliability of the proof of compliance with the specification values.

Executing the method according to one embodiment of the invention with various data topologies may include, for example, driving inverse signals on adjacent signal lines of the memory module. In the process, the method according to one embodiment of the invention takes into account the outputting in accordance with the specification on the basis of coupling effects between the adjacent signal lines. In addition, as a result various worst case topologies, which result in changed properties of the memory module during the testing with changing temperature or changed driver voltage levels, may also be taken into account.

The test data device 7 may be embodied as a test data generator which generates all the test data which is required for the checking. For example, in this way in each checking process a plurality of test data items can be read into the reception register 5 via the signal input/output 2 in the way described above during the internal reading, and subsequently written into the comparator device 10 via the switch device 9, or into the comparator device 10 via the delay element 17.

Figure 3:
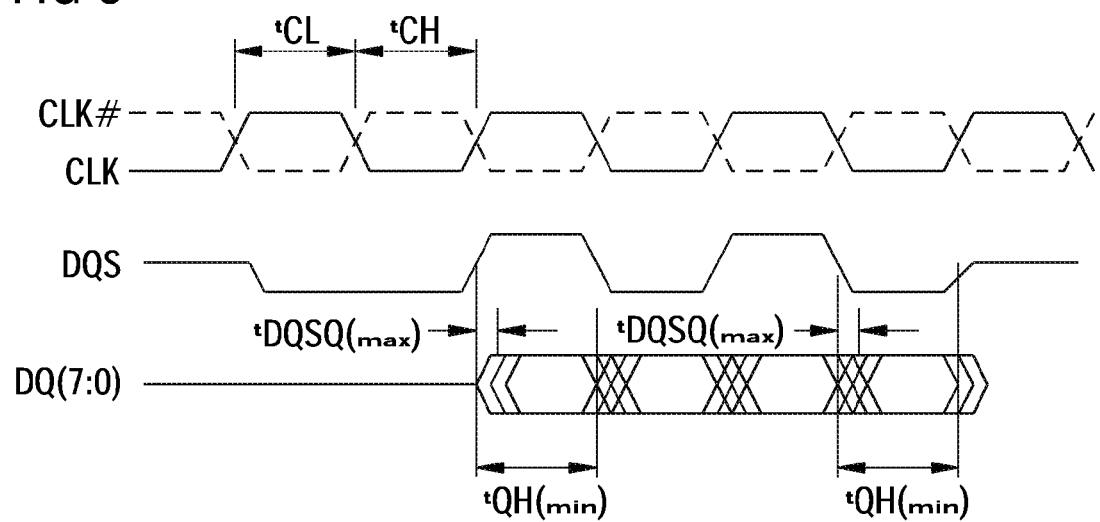
FIG. 3 is a time diagram of signals of the memory module for which the method according to one embodiment of the invention can be used.

FIG. 3 shows a basic variation over time of the data signal DQ(7:0) and of the data sampling signal DQS which are both chronologically referred to a clock signal CLK of the memory module. The maximum permitted set-up time between the data sampling signal DQS and the data signal DQ(7:0) is defined as $t_{DQSQ(max)}$. This time applies both between a rising edge and a falling edge of the data sampling signal DQS and a valid data item of the data signal DQ(7:0). In addition, FIG. 3 illustrates the minimum necessary hold time $t_{QH(min)}$ between the data sampling signal DQS and the data signal DQ(7:0). The minimum necessary hold time $t_{QH(min)}$ is defined both between a rising edge of the data sampling signal DQS and the data signal DQ(7:0) and between a falling edge of the data sampling signal DQS and a valid data item of the data signal DQ(7:0).

FIG. 3 also shows that the data sampling signal DQS and the data signal DQ(7:0) are ideally offset chronologically with respect to one another in an "edge-aligned" fashion. This means that the edges of the data sampling signal DQS and of the data signal DQ(7:0) ideally have a time offset of about zero. If the data sampling signal DQS therefore has its rising edge, the data signal DQ(7:0) should ideally also have its valid data item. As a result, in principle the maximum permitted set-up time $t_{DQSQ(max)}$ constitutes a set-up time and the minimum necessary hold time $t_{QM(min)}$ constitutes a hold time.

The method according to one embodiment of the invention advantageously checks the maximum permitted set-up $t_{DQSQ(max)}$ and the minimum necessary hold time $t_{QH(min)}$ both between the rising edge and the falling edge of the data output signal DQS and the data signal DQ(7:0).

The inventive development of the input/output circuit 1 may be embodied for each of the data signal inputs/outputs 2. In FIG. 2, this diversification (or replication) of the inventive development between the individual data signal inputs/outputs 2 is indicated by data signal inputs/outputs 2, reception registers 5, comparator devices 10 and switch devices 9 which are indicated by dashed lines. It is thus advantageously possible to check whether the data signal is output in relation to the data sampling signal according to the specification for each individual data signal input/output 2.

To obtain an overall check result for the entire memory module from the individual check results for the individual data signal inputs/outputs 2, it may be necessary to link the individual check results to the overall check result. This linking may be carried out, for example, by means of a logical conjunction (AND operation) in the comparator device 10. The overall result depends here on the worst individual results. This means that if only a single input or output of the data signal inputs/outputs 2 is incapable of reading in data in a valid fashion in the course of the internal reading, the entire memory module is evaluated as FAIL. Since there is only one programmable delay device 4 present, the programmable delay device 4 must be programmed in such a way that it brings about the PASS/FAIL transition, described above, for the detection of the external standardization data signal for all the data signal inputs/outputs 2 which are present. This ultimately results in some of the data signal inputs/outputs 2 being tested in a more critical fashion than others. The reason for a nonuniform reading in behavior of the individual data signal inputs/outputs 2 is apparent in the different structure of the individual receiver devices 12 of the individual data signal inputs/outputs 2. These differences are due mainly to inaccuracies in the circuit layout and in the processing equipment.

By using the inventive development of the input/output circuit 1 of the memory module for all the data signal inputs/outputs 2 present, it is advantageously possible to carry out parallel checking of the outputting of the data signal in relation to the data sampling signal according to the specification. Alternatively, of course, serial checking of the outputting according to the specification is also possible with respect to the data signal and the data sampling signal of the individual data signal inputs/outputs 2. This is particularly advantageous if individual data signal inputs/outputs 2 are checked with different test data patterns.

The setting of the PASS/FAIL boundary according to one embodiment of the invention is based on the requirement for the memory module to be better than the guaranteed specification values. The specification values are intended therefore to represent a reliable boundary which is always complied with during the operation of the memory module.

To carry out the method according to one embodiment of the invention, the fact that an external test system is more precise when driving signals than when measuring chronological relationships between signals which are fed to the test system is advantageously exploited. It is considered particularly advantageous here that a high level of precision, inherent in the system, of the external test device 15 is utilized to permit the output time behavior of signals of the memory module to be checked inside the module.

The various aspects of the invention which are disclosed in the description, the patent claims and the figures may be essential to the implementation of the present invention both individually and in any desired combination.

While the foregoing is directed to embodiments of the present invention, other and further embodiments of the invention may be devised without departing from the basic scope thereof, and the scope thereof is determined by the claims that follow.

LIST OF REFERENCES

FIG. 1:
1—input/output circuit
2—data signal input/output
3—data sampling signal input/output
5—reception register
6—synchronization device
8—FIFO shift register
11—driver circuit
12—receiver circuit
14—internal data path FIG. 2:
1—input/output circuit
2—data signal input/output
3—data sampling input/output
4—programmable delay element
5—reception register
6—synchronization device
7—test data device
8—FIFO shift register
9—switch device
10—comparator device
11—driver device
12—receiver device
13—cell array
14—internal data path
15—external test device
16—external test control unit
17—delay element
18—control device

What is claimed is:

1. An apparatus for testing an integrated circuit having a write circuit for outputting a data signal and an associated data sampling signal which have a chronological relationship with one another and a read circuit for receiving the data signal and the associated data sampling signal, the apparatus comprising:
 a setting circuit for setting a chronological offset between the data signal and the associated data sampling signal which are received by the read circuit, wherein the setting circuit is a component of the integrated circuit;
 an external test device for supplying an external standardization data signal and an external standardization data sampling signal to the integrated circuit, wherein the data signal and the associated data sampling signal are replaced by the external standardization data signal and an external standardization data sampling signal in a test mode; and
 a comparator device for comparing data read-in by the read circuit and a provided data from at least one of the data signal and external standardization signal, wherein a fault signal is generated by the comparator device when the read-in data differs from the provided data.

2. The apparatus of claim 1, further comprising:
 a test control device for switching the integrated circuit to the test mode and controlling one or more delay elements and switches in the integrated circuit.

3. The apparatus of claim 1, wherein the setting circuit comprises a programmable delay device for variably setting a delay time (T) for the data sampling signal and the external standardization data sampling signal to be received by the read circuit.

4. The apparatus of claim 1, further comprising:
 a test data device comprising at least one of a data generator and a data memory, wherein test data patterns are provided by the test data device.

5. The apparatus of claim 1, further comprising:
 a cell array for storing results produced by the comparator device, wherein the cell array is integrated in the integrated circuit.

6. The apparatus of claim 5, further comprising:
 a control device for controlling the setting circuit, wherein the chronological offset is set as a function of the results stored in the cell array.

* * * * *